United States Patent
Lee et al.

(10) Patent No.: US 9,935,175 B1
(45) Date of Patent: Apr. 3, 2018

(54) SIDEWALL SPACER FOR INTEGRATION OF GROUP III NITRIDE WITH PATTERNED SILICON SUBSTRATE

(71) Applicant: International Business Machines Corporation, Armonk, NY (US)

(72) Inventors: Ko-Tao Lee, White Plains, NY (US); Devendra K. Sadana, Pleasantville, NY (US); Brent A. Wacaser, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/488,566

(22) Filed: Apr. 17, 2017

(51) Int. Cl.
| | |
|---|---|
| H01L 29/66 | (2006.01) |
| H01L 29/06 | (2006.01) |
| H01L 29/04 | (2006.01) |
| H01L 29/20 | (2006.01) |
| H01L 21/02 | (2006.01) |
| H01L 21/308 | (2006.01) |
| H01L 21/306 | (2006.01) |
| H01L 21/84 | (2006.01) |

(52) U.S. Cl.
CPC .... H01L 29/66553 (2013.01); H01L 21/0254 (2013.01); H01L 21/3081 (2013.01); H01L 21/30625 (2013.01); H01L 21/84 (2013.01); H01L 29/04 (2013.01); H01L 29/0649 (2013.01); H01L 29/2003 (2013.01)

(58) Field of Classification Search
CPC ............... H01L 29/66553; H01L 21/84; H01L 21/30625; H01L 21/3081; H01L 29/2003; H01L 29/04; H01L 29/0649; H01L 21/0254
See application file for complete search history.

(56) References Cited

U.S. PATENT DOCUMENTS

2015/0235838 A1* 8/2015 Bayram .............. H01L 21/0254
257/200

OTHER PUBLICATIONS

Chyurlia, P.N. et al., "Monolithic integration of AlGaN/GaN HFET with MOS on silicon <111> substrates", Electronics Letters, Feb. 4, 2010, pp. 253-254, vol. 46, No. 3.
(Continued)

Primary Examiner — Roy Potter
Assistant Examiner — Paul Patton
(74) Attorney, Agent, or Firm — Scott, Scully, Murphy & Presser, P.C.; Louis J. Percello, Esq.

(57) ABSTRACT

After forming a trench extending through a (100) silicon layer and a buried insulator layer and into a (111) silicon layer of a semiconductor-on-insulator (SOI) substrate, and prior to epitaxial growth of a Group III nitride material from a sub-surface of the (111) silicon layer that is exposed by the trench, a first sidewall spacer including a first dielectric material that can effectively prevent Group III elements from diffusing into silicon of the SOI substrate during the high temperature epitaxial growth of the Group III nitride materials is formed on sidewalls of the trench, following by forming a second sidewall spacer on the first sidewall spacer. The second sidewall spacer includes a second dielectric material that provides better growth selectivity towards the Group III nitride material than the first dielectric material, thus facilitating the growth of the Group III nitride material from the sub-surface of the (111) silicon layer.

20 Claims, 3 Drawing Sheets

(56) References Cited

OTHER PUBLICATIONS

Hoke, W.E. et al., "Monolithic integration of silicon CMOS and GaN transistors in a current mirror circuit", Journal of Vacuum Science & Technology B, Mar./Apr. 2012, pp. 02B101-1 to 02B101-6, vol. 30, Issue 2.

Chung, J et al., "Seamless On-Wafer Integration of Si(100) MOSFETs and GaN HEMTs", IEEE Electron Device Letters, Oct. 2009, pp. 1015-1017, vol. 30, No. 10.

Nam, O. et al., "Lateral Epitaxial Overgrowth of GaN Films on SiO2 Areas via Metalorganic Vapor Phase Epitaxy", Journal of Electronic Materials, Apr. 1998, pp. 233-237, vol. 27, Issue 4.

\* cited by examiner

SIDEWALL SPACER FOR INTEGRATION OF GROUP III NITRIDE WITH PATTERNED SILICON SUBSTRATE

BACKGROUND

The present application relates to semiconductor device fabrication, and more particularly to the integration of Group III nitride materials with a silicon substrate.

Group III nitride compounds, such as gallium nitride (GaN) and its related alloys, are a unique group of semiconductor materials that can be used in a wide variety of applications such as optoelectronics, photovoltaics and lighting. The large bandgap and high electron saturation velocity of the Group III nitride compounds also make them excellent candidates for applications in high temperature and high-speed power electronics.

Many electronics applications incorporate both silicon and Group III nitride circuits due to their unique performance characteristics. The silicon circuits are typically CMOS circuits used for digital signals, and the Group III nitride circuits are used for microwave, millimeter wave or optical signals. This integration can be realized by forming silicon CMOS devices and Group III nitride devices on a common silicon-on-insulator substrate, in which the CMOS devices are formed on an upper silicon layer having a (100) crystallographic orientation, while the Group III nitride devices are formed on a bottom silicon layer having a (111) crystallographic orientation. However, since epitaxial growth of Group III nitride compounds on a (111) silicon layer is typically performed at a relatively high temperature (e.g., 700° C.-1200° C.), the high deposition temperatures cause diffusion of Group III elements into the silicon substrate, which may lead to the deterioration of CMOS device performance. Although diffusion barriers can be employed to prevent the Group III elements from diffusing into the silicon substrate, such diffusion barriers typically do not possess good growth selectivity towards Group III nitride compounds. Methods for integrating Group III nitride materials with a silicon substrate are thus needed to solve the above discussed problems.

SUMMARY

The present application provides a structure and a method that can be used to integrate Group III nitride materials with a silicon substrate.

According to one aspect of the present application, a semiconductor structure is provided. The semiconductor structure includes a semiconductor-on-insulator (SOI) substrate including, from bottom to top, a (111) silicon layer, a buried insulator layer and a (100) silicon layer, at least one Group III nitride material layer embedded within a trench that extends through the (100) silicon layer and the buried insulator layer and into an upper portion of the (111) silicon layer, and a spacer structure located between sidewalls of the trench and sidewalls of the at least one Group III nitride layer. The spacer structure includes a first sidewall spacer adjoined to the sidewalls of the trench and a second sidewall spacer adjoined to the sidewalls of the at least one Group III nitride layer.

According to another aspect of the present application, a method of forming a semiconductor structure is provided. The method includes forming a trench extending through a (100) silicon layer and a buried insulator layer and into an upper portion of a (111) silicon layer of a semiconductor-on-insulator (SOI) substrate. A first sidewall spacer is then formed on sidewalls of the trench. The first sidewall spacer includes a first dielectric material. Next, a second sidewall spacer is formed on the first sidewall spacer. The second sidewall spacer includes a second dielectric material different from the first dielectric material. Next, a Group III nitride buffer layer is formed within the trench.

DETAILED DESCRIPTION

Figure 1:
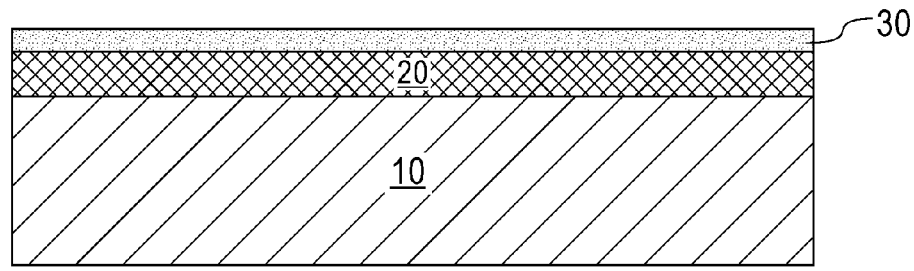
FIG. 1 is a cross-sectional view of an exemplary semiconductor structure after providing a semiconductor-on-insulator (SOI) substrate that includes, from bottom to top, a (111) silicon layer, a buried insulator layer and a (100) silicon layer according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure according to an embodiment of the present application includes a semiconductor-on-insulator (SOI) substrate. The SOI substrate includes, from bottom to top, a silicon layer having a (111) crystallographic orientation (herein referred to as (111) silicon layer 10), a buried insulator layer 20, and a silicon layer having a (100) crystallographic orientation (herein referred to as (100) silicon layer 30). The buried insulator layer 20 isolates the (100) silicon layer 30 from the (111) silicon layer 10.

The (111) silicon layer 10 and the (100) silicon layer 30 can both be single crystalline. Moreover, the (100) silicon layer 30 can be doped, undoped or contain regions that are doped and other regions that are non-doped. The dopant may be an n-type dopant selected from an Element from Group VA of the Periodic Table of Elements (i.e., P, As and/or Sb) or a p-type dopant selected from an Element from Group IIIA of the Periodic Table of Elements (i.e., B, Al, Ga and/or In). The (100) silicon layer 30 may contain one region that is doped with a p-type dopant and another region that is doped with an n-type dopant. The thickness of the (111) silicon layer 10 can be from 600 nm to 2 µm, although lesser and greater thicknesses can also employed. The thickness of the (100) silicon layer 10 can be from 40 nm to 100 nm, although lesser and greater thicknesses can also be employed.

The buried insulator layer 20 may include a dielectric material such as silicon dioxide, silicon nitride, silicon oxynitride, boron nitride or a combination thereof. The thickness of the buried insulator layer 20 can be from 50 nm to 200 nm, although lesser or greater thicknesses can also be employed.

The SOI substrate (10, 20, 30) shown in FIG. 1 can be formed utilizing any conventional bonding process. For example and in one embodiment, the (100) silicon layer 30 can be bonded to a structure comprising the (111) silicon layer 10 and the buried insulator layer 20.

Figure 2:
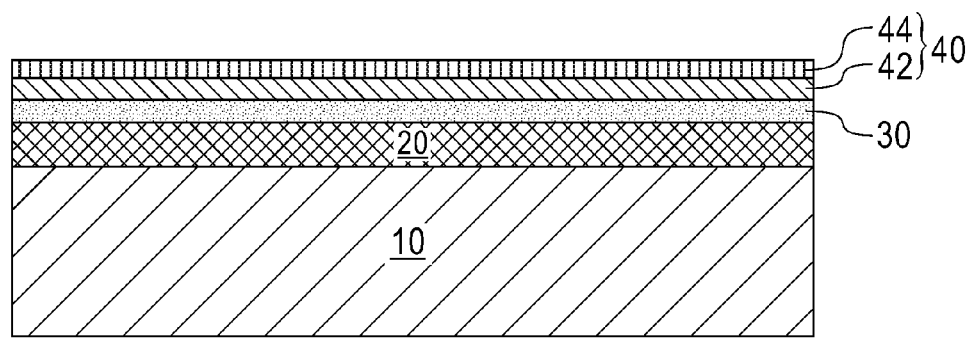
FIG. 2 is a cross-sectional view of the exemplary semiconductor structure of FIG. 1 after forming a pad dielectric stack on the SOI substrate.

Referring to FIG. 2, a pad dielectric stack 40 including at least one dielectric layer is formed on a top surface of the (111) silicon layer 30. The pad dielectric stack 40 can serve as an etch mask during the subsequent formation of trenches within the SOI substrate (10, 20, 30). The pad dielectric stack 40 may comprise a single pad dielectric layer, or the pad dielectric stack 40 may comprise a multilayered structure. For example, the pad dielectric stack 40 may comprise an oxide, a nitride, or a doped silicate glass material, or two or more of the aforementioned materials may be employed. The pad dielectric stack may be formed using a deposition process such as, for example, chemical vapor deposition (CVD), plasma-enhanced chemical vapor deposition (PECVD) or physical vapor deposition (PVD), and/or thermal growth process.

In one embodiment and as shown in FIG. 2, the pad dielectric stack 40 includes a first pad dielectric layer 42, e.g., a pad nitride layer, and a second pad dielectric layer 44, e.g., a pad oxide layer. The second pad dielectric layer 44 is optional and can be omitted in some embodiments of the present application. Thus the pad dielectric stack 40 contains a single pad dielectric layer (not shown). When the first pad dielectric layer 42 is composed of a pad nitride layer, the pad nitride layer may be silicon nitride having a thickness ranging from 1 nm to 100 nm. When the second pad dielectric layer 44 is composed of a pad oxide layer, the pad oxide layer may be silicon dioxide having a thickness ranging from 10 nm to 100 nm.

Figure 3:
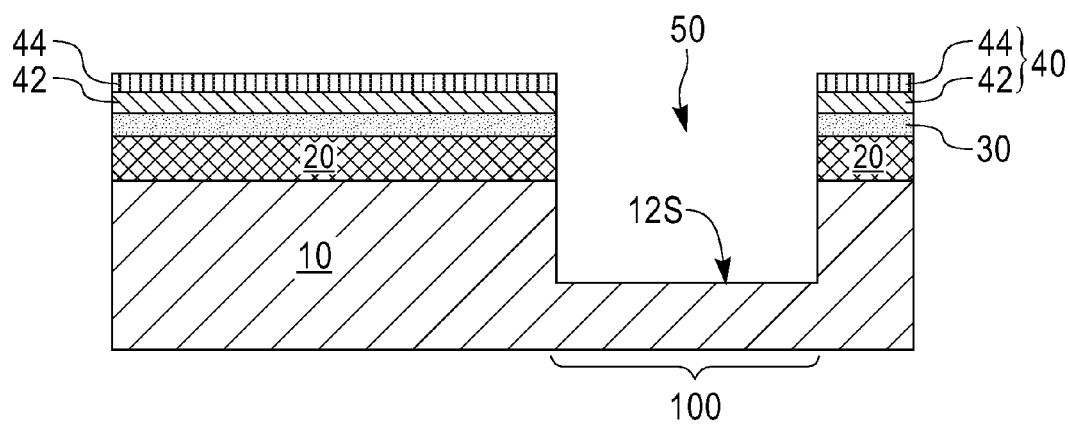
FIG. 3 is a cross-sectional view of the exemplary semiconductor structure of FIG. 2 after forming a trench exposing a sub-surface of the (111) silicon layer.

Referring to FIG. 3, a trench 50 is formed within a Group III nitride device region 100. The trench 50 extends through the (100) silicon layer 30, the buried insulator layer 20 and partially into the (111) silicon layer 10, exposing a sub-surface 12S of the (1111) silicon layer 10 which is located beneath the top surface of the (111) silicon layer 10. By "sub-surface" it is meant a surface of a material that is located between a topmost surface and a bottommost surface of the same material. The depth of the trench 50 can be from 300 nm to 3 µm, although lesser and greater depths can also be employed.

The trench 50 can be formed by lithography and etching. Specifically, a blanket layer of a photoresist material (not shown) is first applied on the topmost surface of the pad dielectric stack 40 (e.g., the top surface of the first pad dielectric layer, or the top surface of the second pad dielectric layer 44 if present) and lithographically patterned to form an opening therein. The pattern of the opening in the photoresist layer is then transferred into the underlying pad dielectric stack 40 and SOI substrate (10, 20, 30) by an anisotropic etch to form the trench 50. In some embodiments, multiple anisotropic etches can be used. The anisotropic etch can be a dry etch such as, for example, reactive ion etch (RIE), or a wet etch. After at least transferring the trench pattern to the pad dielectric stack 40, remaining partitions of the photoresist layer can be removed from the structure utilizing a conventional resist stripping process such as, for example, ashing.

Figure 4:
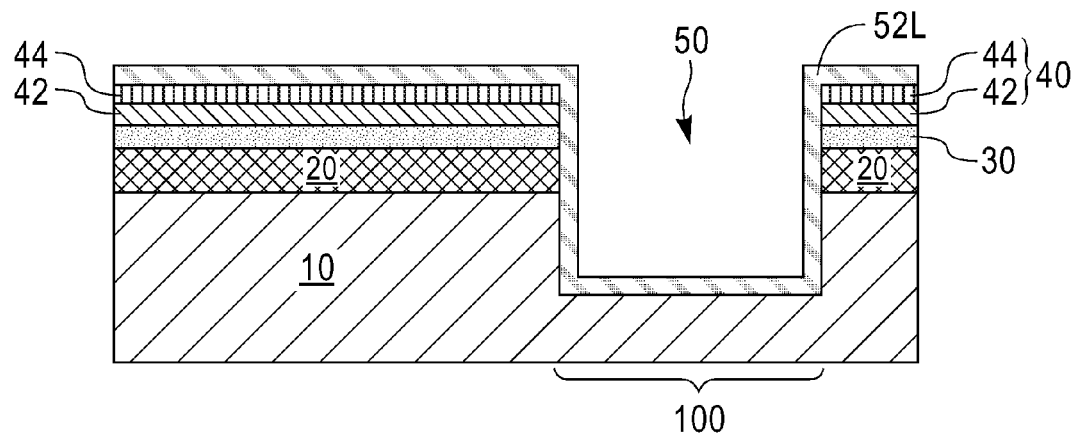
FIG. 4 is a cross-sectional view of the exemplary semiconductor structure of FIG. 3 after forming a first spacer material layer along bottom and sidewall surfaces of the trench and over the topmost surface of the pad dielectric stack.

Referring to FIG. 4, a conformal first spacer material layer 52L is formed along bottom and sidewall surfaces of the trench 50 and over the topmost surface of the pad dielectric stack 40. The first spacer material layer 52L may include a dielectric material that can effectively prevent Group III element from diffusing into (111) and (100) silicon layers 10, 30. In one embodiment, the first spacer material layer 52L includes a dielectric nitride such as, for example, silicon nitride. The first spacer material layer 52L can be formed by a conformal deposition process such as, for example, CVD, PECVD or atomic layer deposition (ALD). The thickness of the first spacer material layer 52L can be from 10 nm to 1 µm, although lesser and greater thicknesses can also be employed.

Figure 5:
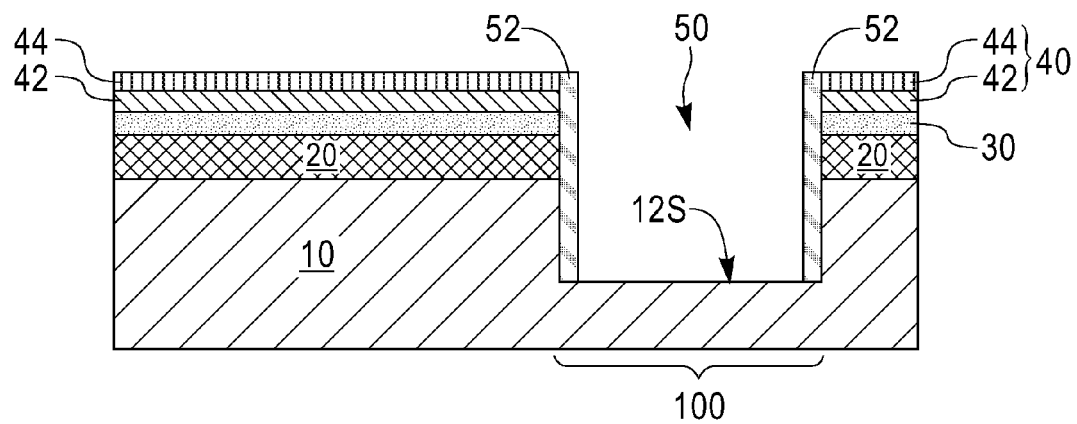
FIG. 5 is a cross-sectional view of the exemplary semiconductor structure of FIG. 4 after forming a first sidewall spacer on sidewalls of the trench.

Referring to FIG. 5, horizontal portions of the first spacer material layer 52L that are located over the topmost surface of the pad dielectric stack 40 and the bottom surface of the trench 50 are removed by an anisotropic etch. The anisotropic etch can be a dry etch such as, for example, RIE or a wet etch that removes the dielectric nitride that provides the first spacer material layer 52L selective to the dielectric material that provides the second pad dielectric layer 44, if present or the dielectric material that provides the first pad dielectric layer 42. The removal of the first spacer material layer 52L from the bottom surface of the trench 50 re-exposes the sub-surface 12S of the (111) silicon layer 10. The remaining portion of the first spacer material layer 52L present on sidewalls of the trench 50 constitute a first sidewall spacer 52. The first sidewall spacer 52 serves as a diffusion barrier preventing the diffusion of Group III element into the silicon substrate during the high temperature Group III nitride growth process subsequently performed.

Figure 6:
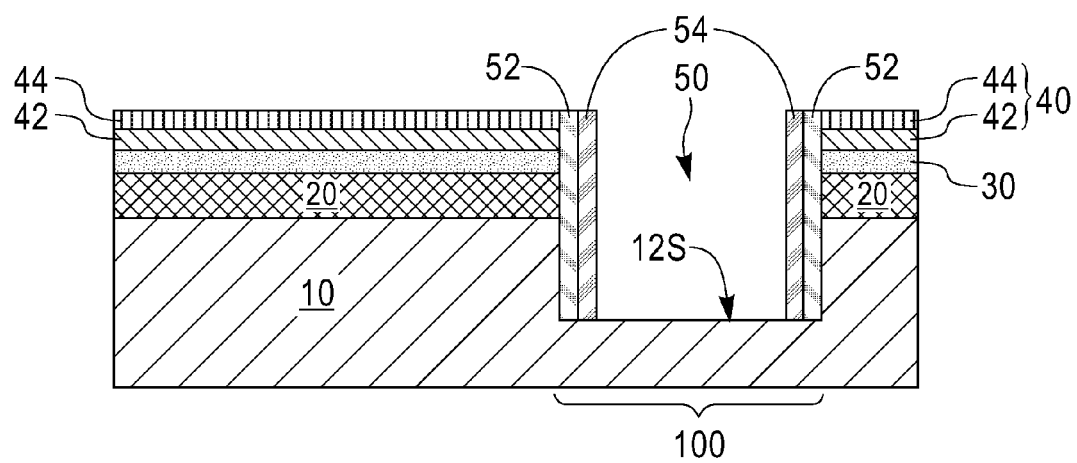
FIG. 6 is a cross-sectional view of the exemplary semiconductor structure of FIG. 5 after forming a second sidewall spacer on the first sidewall spacer.

Referring to FIG. 6, a second sidewall spacer 54 is formed on the first sidewall spacer 52. The second sidewall spacer 54 may include a dielectric material that provides enhanced growth selectivity to Group III nitride materials than the dielectric material that provides the first sidewall spacer 52. In one embodiment, the second sidewall spacer 54 includes a dielectric oxide such as, for example, silicon dioxide, aluminum oxide or hafnium oxide. The second sidewall spacer 54 can be formed by conformally depositing a second spacer material layer (not shown) on the bottom surface of the trench 50, the first sidewall spacer 52 and the topmost surface of the pad dielectric stack 40. The second spacer material layer may be formed, for example, by CVD, PECVD or ALD. The thickness of the second spacer material layer can be from 10 nm to 1 µm, although lesser and greater thicknesses can also be employed. Subsequently, horizontal portions of the second spacer material layer can be removed by an anisotropic etch. The anisotropic etch can be a dry etch such as, for example, RIE or a wet etch that removes the dielectric material that provides the second spacer material layer selective to the dielectric materials that provide the pad dielectric stack 40 and the first sidewall spacer 52. The remaining portion of the second spacer material layer present on the first sidewall spacer 52 constitutes the second sidewall spacer 54.

Figure 7:
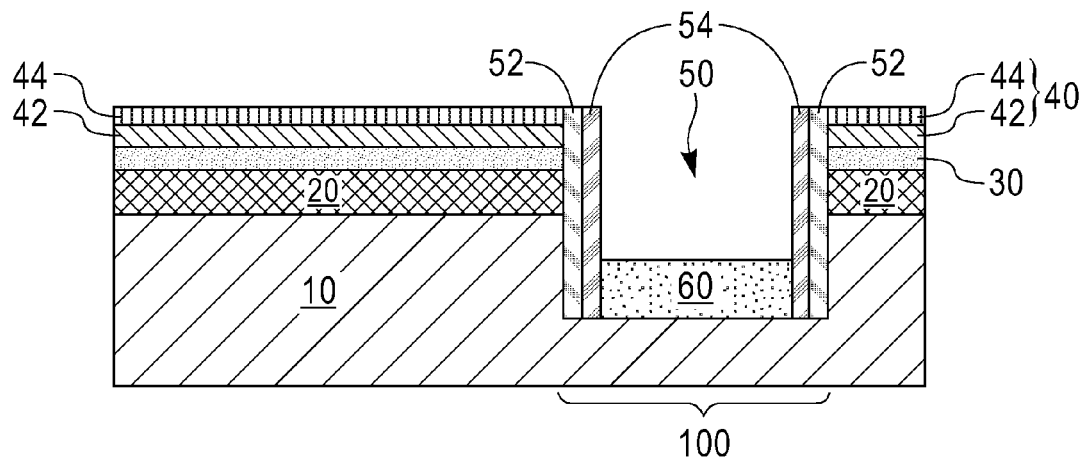
FIG. 7 is a cross-sectional view of the exemplary semiconductor structure of FIG. 6 after forming a Group III nitride buffer layer within the trench.

Referring to FIG. 7, a Group III nitride buffer layer 60 is epitaxially grown from the sub-surface 12S of the (111) silicon layer 10 that is physically exposed at the bottom of the trench 50. The term "Group III nitride" as used throughout the present applicant denotes a compound that is composed of nitrogen and at least one element from Group III, i.e., aluminum (Al), gallium (Ga) and indium (In), of the Periodic Table of Elements. Illustrative examples of some common Group III nitride compounds are GaN, AN, InN, GaInN, AlGaN, and GaAlInN. In one embodiment, the Group III nitride buffer layer 60 is composed of GaN. In another embodiment, the Group III nitride buffer layer 60 is composed of GaN and AlGaN.

The Group III nitride buffer layer 60 may be formed by a selective epitaxial growth process. The selective epitaxial growth process grows the Group III nitride material that provides the Group III nitride buffer layer 60 only from the semiconductor surface such as exposed sub-surface 12S of the (111) silicon layer 10, but not from the dielectric surface, such as sidewall surfaces of the second sidewall spacer 54. In one embodiment, the Group III nitride buffer layer 60 may be formed, for example, by metal-organic chemical vapor deposition (MOCVD). The MOCVD process may include introducing a Group III-containing precursor and a nitride precursor into the reactor chamber of an MOCVD apparatus. In some embodiments, the Group III-containing precursor may be an organo-Group III containing compound, i.e., an organoaluminum compound, an organoindium compound, and/or an organogallium compound. In other embodiments, a Group III halide (typically a chloride) can be employed as the Group III-containing precursor. When an organo-Group III containing compound is employed, the Group III-containing precursor can be, for example, a trialkyl-Group III compound, wherein the alkyl contains from 1 to 6 carbon atoms. Examples of Group III compounds that can be employed in the present application, include, but are not limited to, trimethylaluminum, triethylaluminum, tributylaluminum, trimethylgallium, triethylgallium, tributylgallium, trimethylindium, triethylindium and tributylindium. Examples of nitride containing precursors that can be used include, for example, ammonium nitride.

An inert carrier gas may be present with one of the precursors used in forming the Group III nitride buffer layer 60, or an inert carrier gas can be present with both the precursors (i.e., Group III-containing precursor and a nitride precursor) used in forming the Group III nitride buffer layer 60. The deposition of the Group III nitride buffer layer 60 is typically performed at a temperature ranging from 700° C. to 1200° C. The thickness of the Group III nitride buffer layer 60 that is formed can be from 100 nm to 2 µm, although lesser and greater thicknesses can also be employed.

In some embodiments of the present application, the Group III nitride material that provides the Group III nitride buffer layer 60 can be deposited until it overfills the trench 50 (not shown). In such an embodiment, the overburdened Group III nitride material can be removed by first subjecting the overburdened Group III nitride material to a planarization process such as, for example, chemical mechanical polishing (CMP) and/or grinding, and thereafter a recess etch can be used to remove a topmost portion of the Group III nitride material within the trench 50 so as to provide the Group III nitride buffer layer 60. In another embodiment, a timed MOCVD process can be used in which the deposition only partially fills trench 50 with the Group III nitride material that provides the Group III nitride buffer layer 60. A top surface of the Group III nitride buffer layer 60 is thus located below the top surface of the (100) silicon layer 30.

Figure 8:
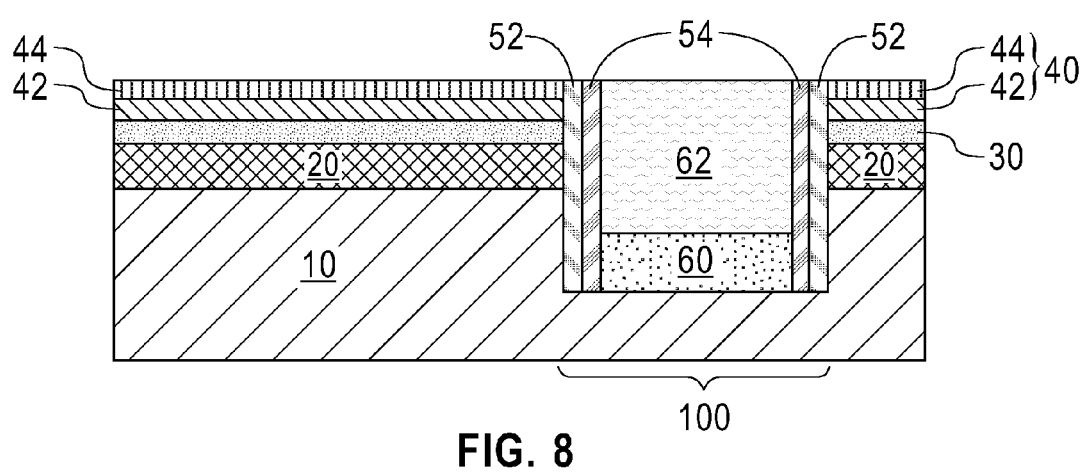
FIG. 8 is a cross-sectional view of the exemplary semiconductor structure of FIG. 7 after forming a Group III nitride channel layer on the Group III nitride buffer layer within the trench.

Referring to FIG. 8, a Group III nitride channel layer 62 is formed on the Group III nitride buffer layer 60. The Group III nitride channel layer 62 may include a Group III nitride material having a bandgap different from the Group III nitride material that provides the Group III nitride buffer layer 60. In one embodiment of the present application, the Group III nitride material that provides the Group III nitride channel layer 62 has a greater bandgap than the Group III nitride material that provides the Group III nitride buffer layer 60. In another embodiment of the present application, the Group III nitride material that provides the Group III nitride channel layer 62 has a lower bandgap than the Group III nitride material that provides the Group III nitride buffer layer 60. In one example, the Group III nitride channel layer 62 is comprised of AlGaN, while the Group III nitride buffer layer 60 is comprised GaN. The Group III nitride channel layer 62 can be formed by MOCVD as described above in forming the Group III nitride buffer layer 60. The top surface of the Group III nitride channel layer 62 can be formed above, coplanar with, or below the top surface of the (100) silicon layer 30. The formation of Group III nitride channel layer 62 is optional, and can be omitted in some embodiments of the present application.

Figure 9:
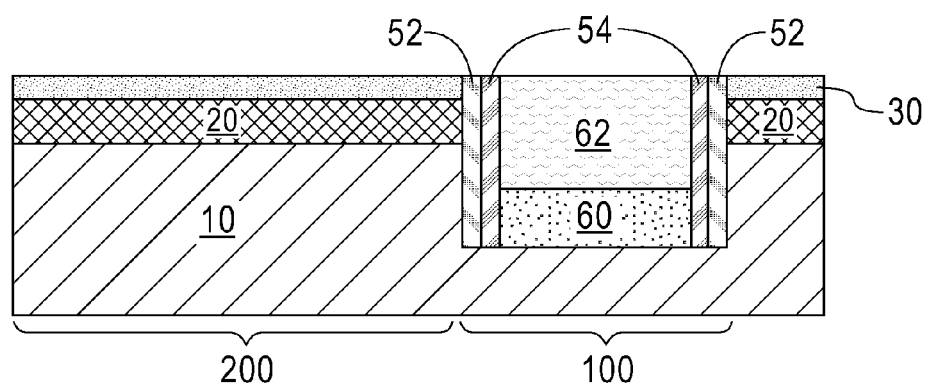
FIG. 9 is a cross-sectional view of the exemplary semiconductor structure of FIG. 8 after removing the pad dielectric stack.

Referring to FIG. 9, the pad dielectric stack 40 and portions of the first sidewall spacer 52, the second sidewall spacer 54 that are located above the top surface of the (100) silicon layer 30 are removed by a planarization process such as, for example, chemical mechanical planarization (CMP). The planarized top surface of each of the first sidewall spacer 52 and the second sidewall spacer 54 is coplanar with the top surface of the (100) silicon layer 30. The removal of the pad dielectric stack 40 re-exposed the top surface of the (100) silicon layer 30.

The planarization process also removes a topmost portion of the Group III nitride channel layer 62 if the Group III nitride channel layer 62 overfills the trench 50. After planarization, the top surface of the Group III nitride channel layer 62 is coplanar with the top surface of the (100) silicon layer 30.

Subsequently, conventional CMOS processing can be employed to form p-type and n-type FETs (not shown) in a FET device region 200 (i.e., a physically exposed region of the (100) silicon layer 30 is located), and to form Group III nitride device in the Group III nitride device region 100.

In the present application, by employing a two-spacer structure, in which the first sidewall spacer 52 adjoined to the silicon sidewalls is employed as a diffusion barrier to prevent the diffusion of Group III elements into the silicon substrate (i.e., (111) silicon layer 10 and (100) silicon layer 30) during the epitaxial deposition of Group III nitride materials, and the second sidewall spacer 54 is employed to provide enhanced growth selectivity for Group III nitride material deposition, the diffusion and growth selectivity problems encountered in the conventional approach for the integration of Group III nitride materials with the silicon substrate are overcome. As a result, the performance of the integrated silicon-based and Group III nitride-based devices can be greatly improved.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
 a semiconductor-on-insulator (SOI) substrate including, from bottom to top, a (111) silicon layer, a buried insulator layer and a (100) silicon layer;
 at least one Group III nitride material layer embedded within a trench that extends through the (100) silicon layer and the buried insulator layer and into an upper portion of the (111) silicon layer; and
 a spacer structure located between sidewalls of the trench and sidewalls of the at least one Group III nitride layer, wherein the spacer structure comprises a first sidewall spacer adjoined to the sidewalls of the trench and a second sidewall spacer adjoined to the sidewalls of the at least one Group III nitride layer.

2. The semiconductor structure of claim 1, wherein the first sidewall spacer comprises silicon nitride.

3. The semiconductor structure of claim 1, wherein the second sidewall spacer comprises silicon dioxide, aluminum oxide or hafnium oxide.

4. The semiconductor structure of claim 1, wherein the at least one Group III nitride material is located atop a sub-surface of the (111) silicon layer.

5. The semiconductor structure of claim 1, wherein the at least one Group III nitride material layer has a topmost surface that is above, coplanar with, or below a top surface of the (100) silicon layer.

6. The semiconductor structure of claim 1, wherein the at least one Group III nitride material layer comprises a Group III nitride buffer layer and a Group III nitride channel layer located on the Group III nitride buffer layer, wherein the Group III nitride channel layer has a top surface that is above, coplanar with, or below a top surface of the (100) silicon layer.

7. The semiconductor structure of claim 6, wherein the Group III nitride buffer layer comprises GaN, and the Group III nitride channel layer comprises AlGaN.

8. The semiconductor structure of claim 1, wherein the second sidewall spacer is in direct contact with entire sidewalls of the at least one Group III nitride material layer.

9. A method of forming a semiconductor structure comprising:
 forming a trench extending through a (100) silicon layer and a buried insulator layer and into an upper portion of a (111) silicon layer of a semiconductor-on-insulator (SOI) substrate;
 forming a first sidewall spacer on sidewalls of the trench, wherein the first sidewall spacer comprises a first dielectric material;
 forming a second sidewall spacer on the first sidewall spacer, wherein the second sidewall spacer comprises a second dielectric material different from the first dielectric material; and
 forming a Group III nitride buffer layer within the trench.

10. The method of claim 9, wherein the trench exposes a sub-surface of the (111) silicon layer that is located below a top surface of the (111) silicon layer.

11. The method of claim 9, wherein the forming the trench comprises:
 forming a pad dielectric stack on a top surface of the (100) silicon layer;
 forming a patterned photoresist layer on the pad dielectric stack;
 transferring a pattern in the patterned photoresist layer through the pad dielectric stack, the (100) silicon layer and the buried insulator layer and into the upper portion of the (111) silicon layer.

12. The method of claim 11, wherein the pad dielectric stack comprises a first pad dielectric layer and a second pad dielectric layer.

13. The method of claim 12, wherein the first pad dielectric layer comprises silicon nitride, and the second pad dielectric layer comprises silicon dioxide.

14. The method of claim 9, wherein the first sidewall spacer comprises silicon nitride.

15. The method of claim 9, wherein the second sidewall spacer comprises silicon dioxide, aluminum oxide or hafnium oxide.

16. The method of claim 11, wherein the forming the first spacer comprises:
 forming a first spacer material layer along sidewall and bottom surfaces of the trench and on a topmost surface of the pad dielectric stack; and
 removing horizontal portions of the first spacer material layer.

17. The method of claim 16, wherein the forming the second spacer comprises:
 forming a second spacer material layer on the bottom surface of the trench, the first sidewall spacer and the topmost surface of the pad dielectric stack; and
 removing horizontal portions of the second spacer material layer.

18. The method of claim 10, wherein the forming the Group III nitride buffer layer comprises epitaxially growing a Group III nitride material from the sub-surface of the (111) silicon layer.

19. The method of claim 9, further comprising forming a Group III nitride channel layer on the Group III nitride buffer layer by a selective epitaxial growth process.

20. The method of claim 19, wherein the Group III nitride buffer layer comprises GaN, and the Group III nitride channel layer comprises AlGaN.

* * * * *